US011818847B2

(12) United States Patent
Kanbe et al.

(10) Patent No.: US 11,818,847 B2
(45) Date of Patent: Nov. 14, 2023

(54) RESIST LAYER FORMING METHOD, METHOD FOR MANUFACTURING WIRING BOARD, AND RESIST LAYER FORMING APPARATUS

(71) Applicant: SHINKO ELECTRIC INDUSTRIES CO., LTD., Nagano (JP)

(72) Inventors: Yoshihisa Kanbe, Nagano (JP); Toyoaki Sakai, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 18 days.

(21) Appl. No.: 17/658,005

(22) Filed: Apr. 5, 2022

(65) Prior Publication Data

US 2022/0338354 A1 Oct. 20, 2022

(30) Foreign Application Priority Data

Apr. 16, 2021 (JP) ................................ 2021-069941

(51) Int. Cl.
*H05K 3/10* (2006.01)
*H05K 3/42* (2006.01)
*H05K 3/06* (2006.01)

(52) U.S. Cl.
CPC ............ *H05K 3/108* (2013.01); *H05K 3/064* (2013.01); *H05K 3/423* (2013.01); *H05K 2203/0143* (2013.01); *H05K 2203/0554* (2013.01); *H05K 2203/0582* (2013.01)

(58) Field of Classification Search
CPC ........ H05K 3/108; H05K 3/064; H05K 3/423; H05K 3/0079; H05K 3/4644; H05K 2203/0143; H05K 2203/0554; H05K 2203/0582; H05K 2203/068
See application file for complete search history.

(56) References Cited

U.S. PATENT DOCUMENTS 3,574,026 A * 4/1971 Kucheck ................ B31D 1/026 428/40.1
4,127,436 A * 11/1978 Friel .................. B32B 37/1018 156/247
5,330,595 A * 7/1994 Held ...................... B29C 43/28 156/244.27
5,344,893 A * 9/1994 Asai ....................... C08G 59/38 428/209
10,421,313 B2 * 9/2019 Lavosky .................. B44C 3/02
11,446,845 B2 * 9/2022 Sasaki ................... B29C 70/506
2009/0126974 A1 * 5/2009 Yuasa ................... B29C 70/506 174/250
2014/0299253 A1 * 10/2014 Minamida .............. B32B 29/02 156/64

(Continued)

FOREIGN PATENT DOCUMENTS

JP S62-093994 4/1987
JP 2002-225059 8/2002

(Continued)

*Primary Examiner* — Jeffrey T Carley
(74) *Attorney, Agent, or Firm* — IPUSA, PLLC

(57) ABSTRACT

A resist layer forming method includes a process of laminating a resist layer on a base at a first pressure using a laminate roller having a first temperature, and a process of pressing the resist layer against the base at a second pressure higher than the first pressure using a metal plate having a second temperature lower than the first temperature.

7 Claims, 16 Drawing Sheets

(56) References Cited

U.S. PATENT DOCUMENTS

2022/0304166 A1* 9/2022 Kadowaki .............. H05K 3/106

FOREIGN PATENT DOCUMENTS

JP 2004193519 A * 7/2004
JP 2006303489 A * 11/2006 ............... H05K 3/44
JP 2012212915 A * 11/2012
KR 20090016440 A * 2/2009
WO WO-0059275 A1 * 10/2000 ............. H05K 3/064

* cited by examiner

1

RESIST LAYER FORMING METHOD, METHOD FOR MANUFACTURING WIRING BOARD, AND RESIST LAYER FORMING APPARATUS

CROSS-REFERENCE TO RELATED APPLICATIONS

This application is based upon and claims priority to Japanese Patent Application No. 2021-069941, filed on Apr. 16, 2021, the entire contents of which are incorporated herein by reference.

FIELD

Certain aspects of the embodiments discussed herein are related to resist layer forming methods, methods for manufacturing wiring boards, and resist layer forming apparatuses.

BACKGROUND

When forming an interconnect layer of a wiring board by a semi-additive method, a seed layer is formed, a plating resist layer made of a dry film resist (DFR) is laminated on the seed layer, and an opening is formed in the plating resist layer. Thereafter, a metal plating layer is formed inside the opening of the plating resist layer, the plating resist layer is stripped, and the seed layer is removed by flush etching.

For example, Japanese Laid-Open Patent Publication No. 2002-225059 and Japanese Laid-Open Patent Publication No. S62-093994 propose techniques related to the resist layer forming method.

When the resist layer is famed by the conventional method for use in manufacturing a wiring board, a short circuit may occur between mutually adjacent conductive patterns of the interconnect layer.

SUMMARY

One object of the present disclosure is to provide a resist layer forming method, a method for manufacturing a wiring board, and a resist layer foiling apparatus, which can reduce a short circuit from occurring between conductive patterns.

According to one aspect of the present disclosure, a resist layer forming method includes laminating a resist layer on a base at a first pressure using a laminate roller having a first temperature; and pressing the resist layer against the base at a second pressure higher than the first pressure using a metal plate having a second temperature lower than the first temperature.

According to another aspect of the present disclosure, a resist layer forming apparatus includes a laminator configured to laminate a resist layer on a base at a first pressure using a laminate roller having a first temperature; a forming press configured to press the resist layer against the base at a second pressure using a metal plate having a second temperature; and a controller configured to control the laminator and the forming press, wherein the controller controls the second temperature to a temperature lower than the first temperature, and controls the second pressure to a pressure higher than the first pressure.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

The present inventors conducted diligent studies to determine a cause of a short circuit that occurs between conductive patterns in a conventional method for manufacturing the wiring board. As a result, it was found that a gap may be formed between a seed layer and a plating resist layer made of a dry film resist (DFR) according to the conventional manufacturing method, and that the short circuit is caused by the gap. As an example, processes in which the short circuit occurs due to the gap will be described, by referring to a reference example. FIG. 1A through FIG. 2B are cross sectional views illustrating the processes in which the short circuit occurs due to the gap.

Figure 1A:
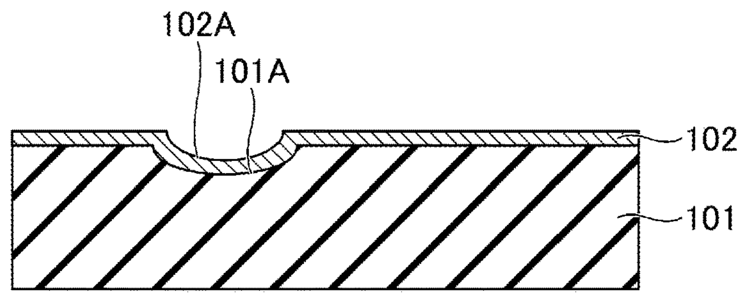
FIG. 1A, FIG. 1B, and FIG. 1C are cross sectional views (part 1) illustrating processes in which a short circuit occurs due to a gap.

In the method according to the reference example, a seed layer 102 is formed on a surface of an insulating layer 101, as illustrated in FIG. 1A. In this state, if a recess 101A is present at the surface of the insulating layer 101, a recess 102A, which follows the recess 101A, is famed at a surface of the seed layer 102.

Figure 1B:
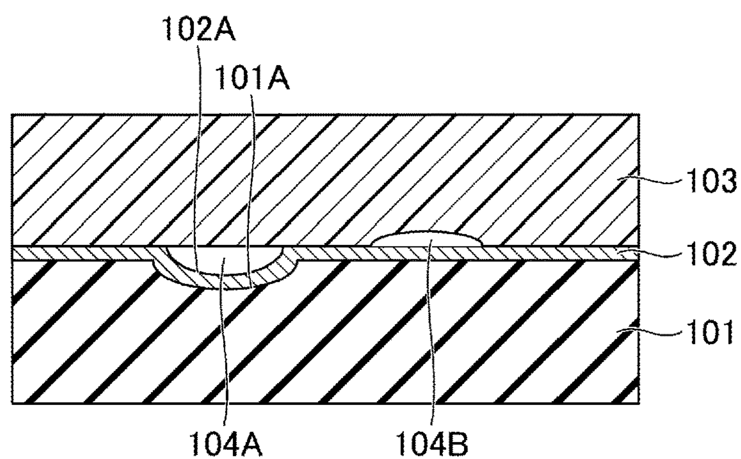

Next, a plating resist layer 103, made of a DFR, is laminated on the seed layer 102, as illustrated in FIG. 1B. The plating resist layer 103 is laminated using a device including a laminate roller, for example. In this state, a large pressure cannot be applied to the insulating layer 101 and the seed layer 102 from the laminate roller which rotates around a rotating shaft. For this reason, the plating resist layer 103 cannot enter inside the recess 102A at the surface of the seed layer 102, thereby forming a gap 104A between the recess 102A and the plating resist layer 103. In addition, a gap 104B may be formed between a flat portion of seed layer 102 and plating resist layer 103.

Figure 1C:
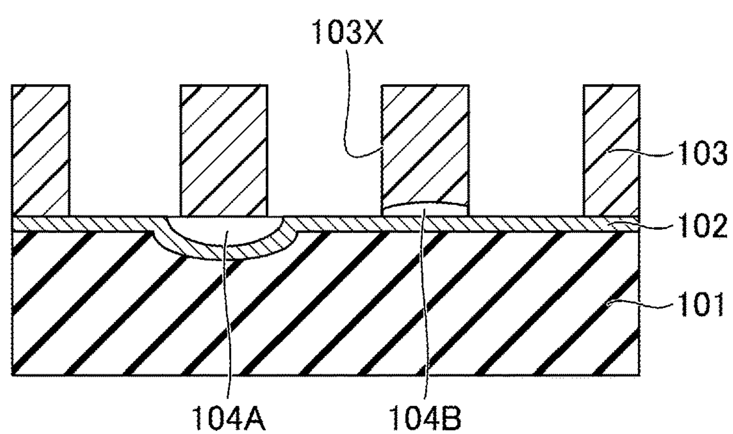

Next, the plating resist layer 103 is exposed and developed, to form openings 103X in the plating resist layer 103, as illustrated in FIG. 1C. In this state, portions of the gaps 104A and 104B may remain.

Figure 2A:
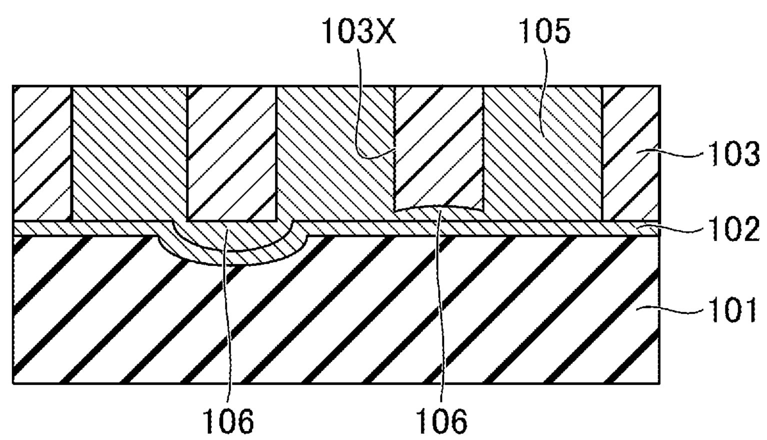
FIG. 2A and FIG. 2B are cross sectional views (part 2) illustrating processes in which the short circuit occurs due to the gap.

Next, a metal plating layer 105 is formed inside the openings 103X of the plating resist layer 103 by an electrolytic plating which utilizes the seed layer 102 for a plating power supply path, as illustrated in FIG. 2A. In this state, if portions of the gaps 104A and 104B remain, the metal plating layer 105 is also formed in these portions of the gaps 104A and 104B. In other words, the excess conductive layer 106 may be present between the insulating layer 101 and the plating resist layer 103, in addition to the seed layer 102.

Figure 2B:
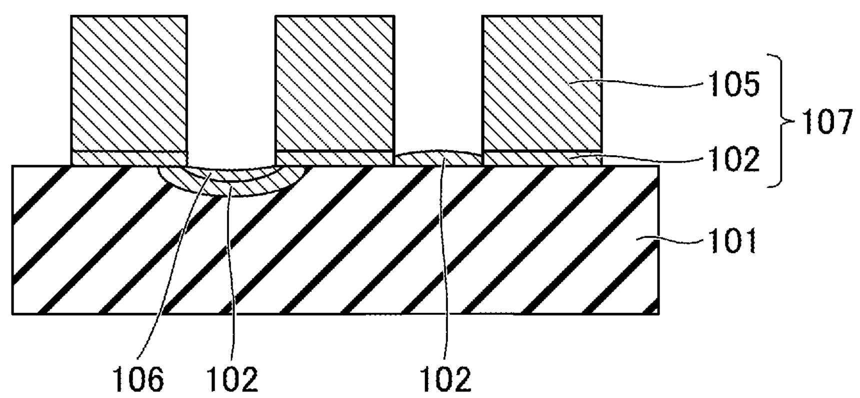

Next, the plating resist layer 103 is removed, as illustrated in FIG. 2B. Further, the seed layer 102 is removed by a flush etching, using the metal plating layer 105 as a mask. A plurality of conductive patterns 107, including the seed layer 102 and the metal plating layer 105, is formed in this manner. However, the seed layer 102 between the conductive layer 106 and the insulating layer 101 may remain, depending on a thickness of the conductive layer 106. In addition, the conductive layer 106 may remain. For this reason, a short circuit may occur between mutually adjacent conductive patterns 107.

Hence, the short circuit may occur due to the gap 104A or 104B between the seed layer 102 and the plating resist layer 103.

Based on these findings, the inventors conceived the following embodiments.

Preferred embodiments of the present invention will be described hereinafter, with reference to the accompanying drawings. In the drawings, those parts that are the same are designated by the same reference numerals, and a repeated description of the same parts may be omitted.

A description will now be given of a resist layer forming apparatus, a resist layer forming method, and a method for manufacturing a wiring board according to each embodiment of the present invention.

First Embodiment

First, a first embodiment will be described. The first embodiment relates to a resist layer forming apparatus.

<Configuration of Resist Layer Forming Apparatus>

Figure 3:
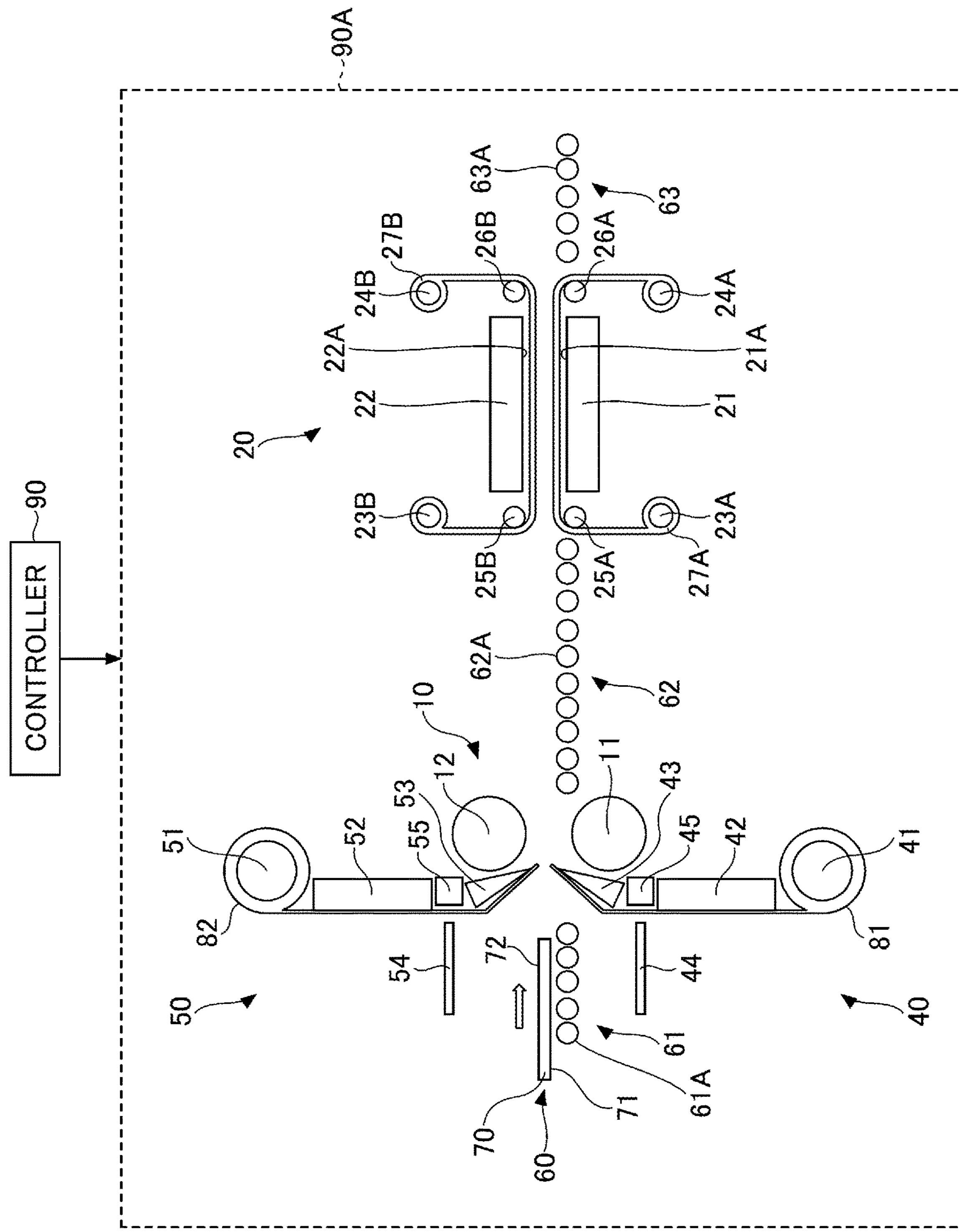
FIG. 3 is schematic diagram illustrating a resist layer forming apparatus according to a first embodiment.

FIG. 3 is a schematic diagram illustrating a resist layer forming apparatus according to the first embodiment. A resist layer forming apparatus 1 according to the first embodiment includes, among other things, a laminator 10, a forming press 20 for pressing a target member into a sheet or plate-shaped member, a first feeding unit 40, a second feeding unit 50, a transport passage (or loading and unloading passage) 60, and a controller 90.

The transport passage 60 includes a first transport unit (or first loading and unloading unit) 61, a second transport unit (or second loading and unloading unit) 62, and a third transport unit (or third loading and unloading unit) 63, and is configured to transport a base 70. The transport passage 60 is disposed in a generally horizontal arrangement. With respect to a moving direction of the base 70, the second transport unit 62 is disposed on a downstream side of the first transport unit 61, and the third transport unit 63 is disposed on a downstream side of the second transport unit 62. The laminator 10 is disposed between the first transport unit 61 and the second transport unit 62, and the forming press 20 is disposed between the second transport unit 62 and the third transport unit 63.

The first transport unit 61 includes a plurality of transport rollers 61A, and is configured to transport the base 70 from an apparatus of a preceding stage, such as a seed layer forming apparatus, for example, to the laminator 10. The base 70 has a first surface (lower surface) 71 which making contact with the transport roller 61A, and a second surface (upper surface) 72 opposite to the first surface 71.

The laminator 10 includes a first laminate roller 11, and a second laminate roller 12. The first laminate roller 11 and the second laminate roller 12 have an approximately cylindrical shape, respectively. The first laminate roller 11 and the second laminate roller 12 are arranged, so that the transport passage 60 is disposed between the first laminate roller 11 and the second laminate roller 12. The first laminate roller 11 is arranged under the transport passage 60, so as to press against the first surface 71 of the base 70, while the second laminate roller 12 is arranged above the transport passage 60, so as to press against the second surface 72 of the base 70.

The first feeding unit 40 is arranged under the laminator 10, and includes a first feed roller 41, a first suction plate 42, a first guide 43, a first cutter 44, and a first cutter backup 45. The first feeding unit 40 is configured to feed a first DFR 81, which is wound around the first feed roller 41, between the base 70 and the first laminate roller 11. With respect to a moving direction of the first DFR 81, the first suction plate 42 is disposed on a downstream side of the first feed roller 41, and the first guide 43 is disposed on the downstream side of the first feed roller 41. In addition, the first cutter 44 and the first cutter backup 45 are disposed between the first suction plate 42 and the first guide 43.

The first DFR 81 drawn out from the first feed roller 41 is guided between the base 70 and the first laminate roller 11 by the first guide 43, while deformation is reduced by the first suction plate 42. The first cutter 44 and the first cutter backup 45 are used to cut the first DFR 81 when lamination of the first DFR 81 on one base 70 is completed. The first DFR 81 can be cut by pressing a blade of the first cutter 44 against the first cutter backup 45, while sandwiching the first DFR 81 between the first cutter 44 and the first cutter backup 45.

The second feeding unit 50 is disposed above the laminator 10, and includes a second feed roller 51, a second suction plate 52, a second guide 53, a second cutter 54, and a second cutter backup 55. The second feeding unit 50 is configured to feed a second DFR 82, which is wound around the second feed roller 51, between the base 70 and the second laminate roller 12. With respect to a moving direction of the second DFR 82, the second suction plate 52 is disposed on a downstream side of the second feed roller 51, and the second guide 53 is disposed on the downstream side of the second feed roller 51. Moreover, the second cutter 54 and the second cutter backup 55 are disposed between the second suction plate 52 and the second guide 53.

The second DFR 82 drawn out from the second feed roller 51 is guided between the base 70 and the second laminate roller 12 by the second guide 53, while deformation is reduced by the second suction plate 52. The second cutter 54 and the second cutter backup 55 are used to cut the second DFR 82 when lamination of the second DFR 82 on one base 70 is completed. The second DFR 82 can be cut by pressing a blade of the second cutter 54 against the second cutter backup 55, while sandwiching the second DFR 82 between the second cutter 54 and the second cutter backup 55.

The laminator 10 presses the first DFR 81 fed from the first feeding unit 40 against the first surface 71 of the base 70 by the first laminate roller 11, and presses the second DFR 82 fed from the second feeding unit 50 against the second surface 72 of the base 70 by the second laminate roller 12, while rotating the first laminate roller 11 and the second laminate roller 12. Accordingly, as the base 70 passes between the first laminate roller 11 and the second laminate roller 12, a first plating resist layer 81A illustrated in FIG. 5 and made of the first DFR 81 is laminated on the first surface 71, and a second plating resist layer 82A illustrated in FIG. 5 and made of the second DFR 82 is laminated on the second surface 72. Hereinafter, the base 70 on which the first plating resist layer 81A and the second plating resist layer 82A are laminated, may also be referred to as a resist-deposited base.

The second transport unit 62 includes a plurality of transport rollers 62A, and is configured to transport the resist-deposited base output from the laminator 10 to the forming press 20.

The forming press 20 includes a first metal plate 21, an unwinding roll (or supply roll) 23A, a winding roll (or take-up roll) 24A, a guide roller 25A, a guide roller 26A, a first transport film 27A, a second metal plate 22, an unwinding roll 23B, a winding roll 24B, a guide roller 25B, a guide roller 26B, and a second transport film 27B.

The first metal plate 21 and the second metal plate 22 are arranged, so that the transport passage 60 is disposed between the first metal plate 21 and the second metal plate 22. The first metal plate 21 is disposed under the transport passage 60, so as to press against a surface of the resist-deposited base corresponding to the first surface 71. The second metal plate 22 is disposed above the transport passage 60, so as to press against a surface of the resist-deposited base corresponding to the second surface 72. The first metal plate 21 has a first flat surface 21A opposing the transport passage 60, and the second metal plate 22 has a second flat surface 22A opposing the transport passage 60. The first metal plate 21 and the second metal plate 22 are made of steel, such as stainless steel or the like, for example, but may be made of other metals.

The unwinding roll 23A, the winding roll 24A, the guide roller 25A, the guide roller 26A, and the first transport film 27A are disposed under the transport passage 60. The first transport film 27A is suspended between the unwinding roll 23A and the winding roll 24A, via the guide rollers 25A and 26A. The first transfer film 27A is unwound from the unwinding roll 23A, and is wound on the winding roll 24A while passing between the first flat surface 21A and the second flat surface 22A.

The unwinding roll 23B, the winding roll 24B, the guide roller 25B, the guide roller 26B, and the second transport film 27B are disposed above the transport passage 60. The second transport film 27B is suspended between the unwinding roll 23B and the winding roll 24B, via guide rollers 25B and 26B. The second transfer film 27B is unwound from the unwinding roll 23B, and is wound on the winding roll 24B while passing between the first flat surface 21A and the second flat surface 22A.

The resist-deposited base can be transported to a position between the first metal plate 21 and the second metal plate 22, while the resist-deposited base is sandwiched between the first transfer film 27A and the second transfer film 27B.

When the resist-deposited base is transported to the forming press 20 by the second transport unit 62, the first transport film 27A and the second transport film 27B transport the resist-deposited base to a position between the first metal plate 21 and the second metal plate 22. In addition, the resist-deposited base is pressed by the first metal plate 21 and the second metal plate 22. In other words, the first metal plate 21 and the second metal plate 22 are used to press the resist-deposited base between the first flat surface 21A and the second flat surface 22A. After the pressing by the first metal plate 21 and the second metal plate 22, the first transport film 27A and the second transport film 27B output the resist-deposited base toward the third transport unit 63.

The third transport unit 63 includes a plurality of transport rollers 63A, and is configured to transport the resist-deposited base output from the forming press 20 to an apparatus of a subsequent stage, such as an exposure apparatus for exposing the first plating resist layer 81A and the second plating resist layer 82A, for example.

The controller 90 controls the operation of a processing system 90A which includes the laminator 10, the forming press 20, the first feeding unit 40, the second feeding unit 50, and the transport passage 60.

The resist layer forming apparatus 1 includes such a configuration described above.

<Operation of Resist Layer Forming Apparatus>

Next, an operation of the resist layer forming apparatus 1, that is, a resist layer forming method, will be described. FIG. 4 through FIG. 7 are schematic diagrams illustrating the operation of the resist layer forming apparatus 1. The series of operations illustrated in FIG. 4 through FIG. 7 is controlled by the controller 90. FIG. 8A through FIG. 8C are cross sectional views illustrating processes of forming the first plating resist layer 81A and the second plating resist layer 82A on the base 70.

Figure 4:
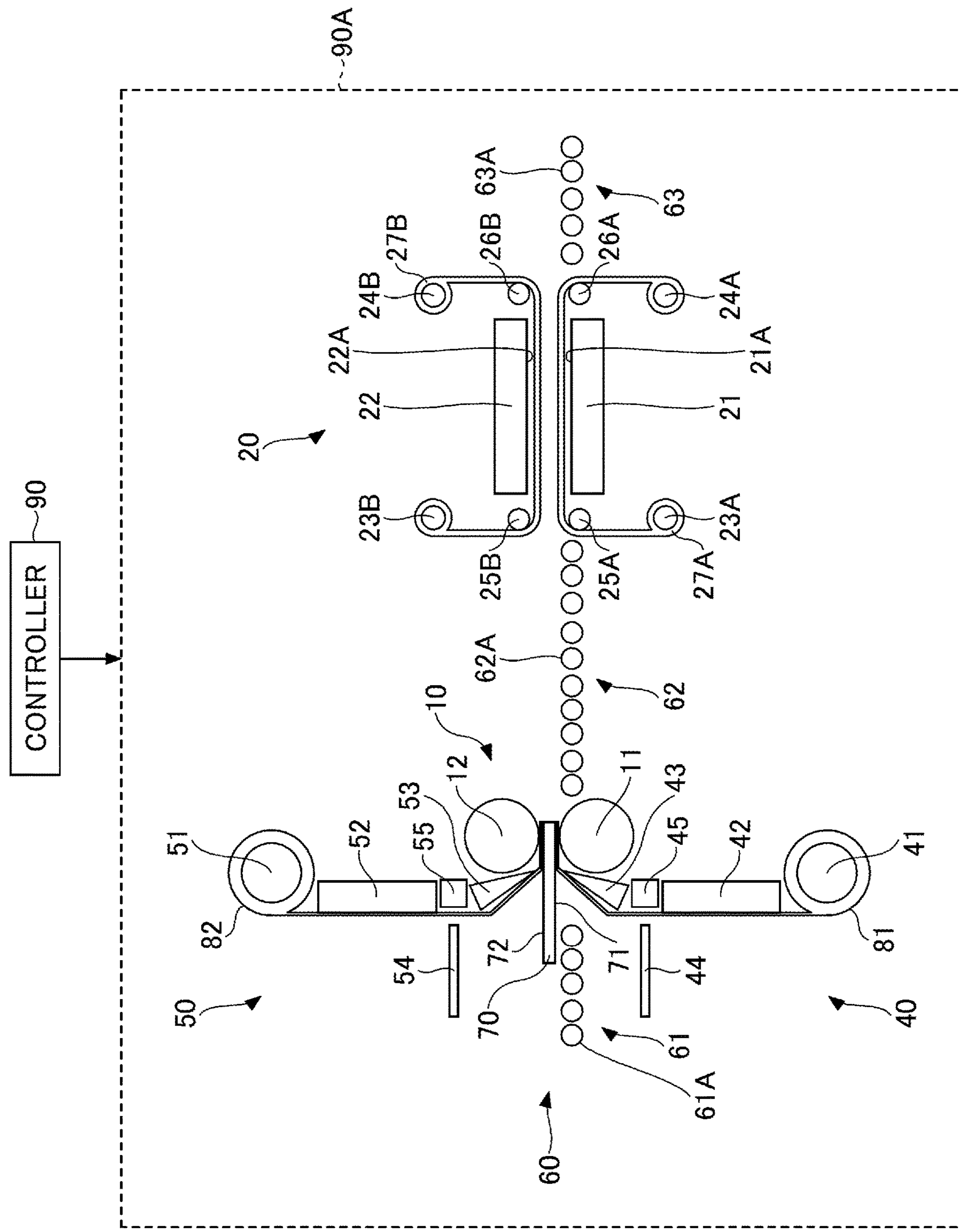
FIG. 4 is a schematic diagram (part 1) illustrating an operation of the resist layer forming apparatus according to the first embodiment.

First, the base 70 is transported to the laminator 10 by the first transport unit 61, as illustrated in FIG. 4. The base 70 includes a base 75, a first seed layer 76 forming the first surface 71, and a second seed layer 77 forming the second surface 72, for example, as illustrated in FIG. 8A. A recess 71A may be present at the first surface 71 of the base 70, and a recess 72A may be present at the second surface 72 of the base 70.

In the laminator 10, the first laminate roller 11 and the second laminate roller 12 rotate while sandwiching the base 70 therebetween, to laminate a first plating resist layer 81A formed of the first DFR 81 on the first surface 71 of the base 70, and to laminate a second plating resist layer 82A formed of the second DFR 82 on the second surface 72 of the base 70. A pressure (first pressure) applied to the base 70 from the first laminate roller 11 and the second laminate roller 12 is preferably in a range of 0.2 MPa to 0.6 MPa, and more preferably in a range of 0.3 MPa to 0.5 MPa. A temperature (first temperature) of the first laminate roller 11 and the second laminate roller 12 is preferably in a range of 60° C. to 140° C., and more preferably in a range of 80° C. to 120° C.

If the recess 71A is present at the first surface 71 of the base 70, as illustrated in FIG. 8B, the first plating resist layer 81A may not be able to enter inside the recess 71A, to thereby form a gap 83A between the recess 71A and the first plating resist layer 81A. In addition, a gap 83B may be formed between a flat portion of the first surface 71 and the first plating resist layer 81A. Similarly, if the recess 72A is present at the second surface 72 of the base 70, the second plating resist layer 82A may not be able to enter inside the recess 72A, to thereby form a gap 84A between the recess 72A and the second plating resist layer 82A. Moreover, a gap 84B may be formed between a flat portion of the second surface 72 and the second plating resist layer 82A.

Figure 5:
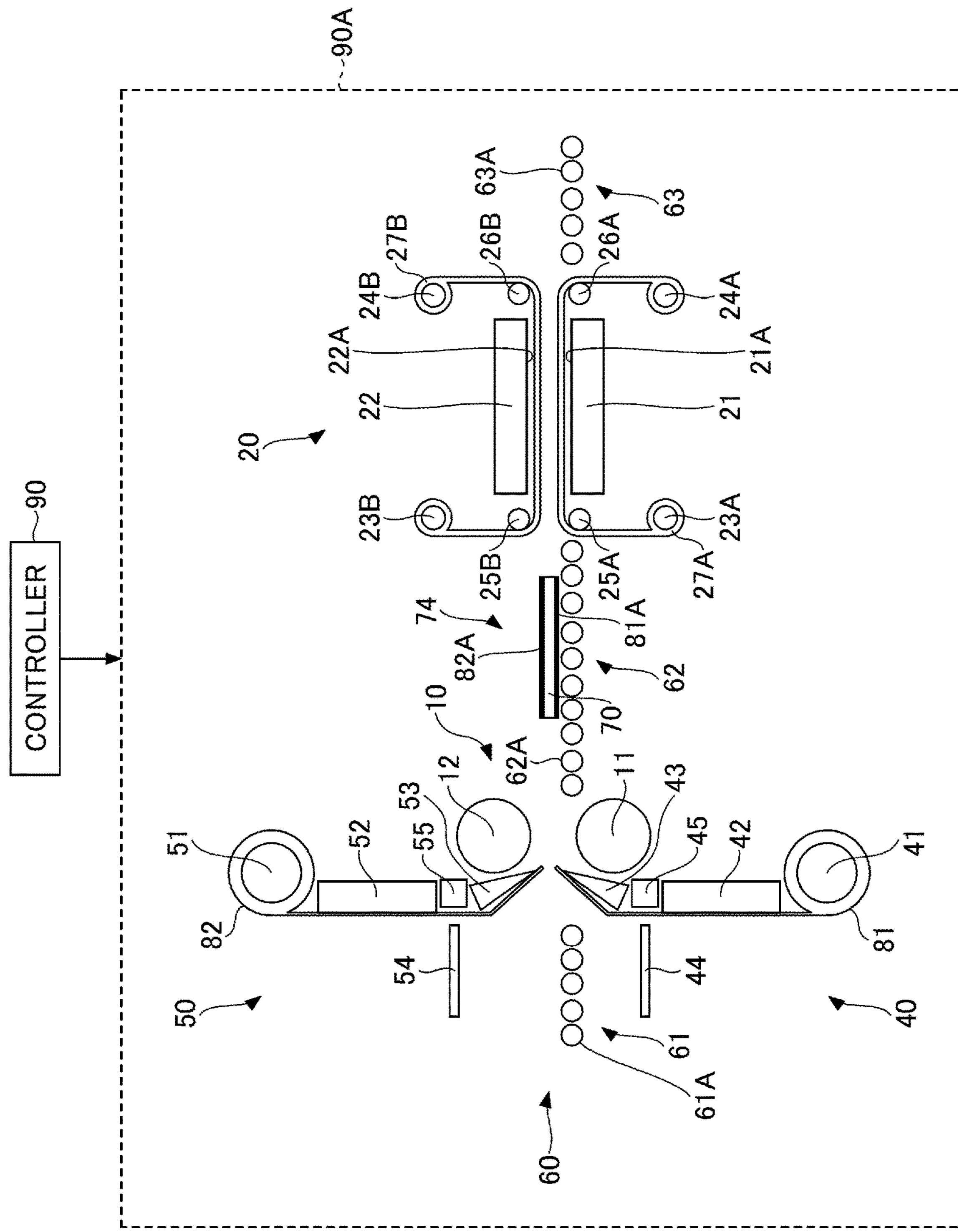
FIG. 5 is a schematic diagram (part 2) illustrating the operation of the resist layer forming apparatus according to the first embodiment.

When the base 70 having the first plating resist layer 81A and the second plating resist layer 82A formed thereon, that is, a resist-deposited base 74, is output from the laminator 10, the second transport unit 62 transports the resist-deposited base 74 to the forming press 20, as illustrated in FIG. 5.

Figure 6:
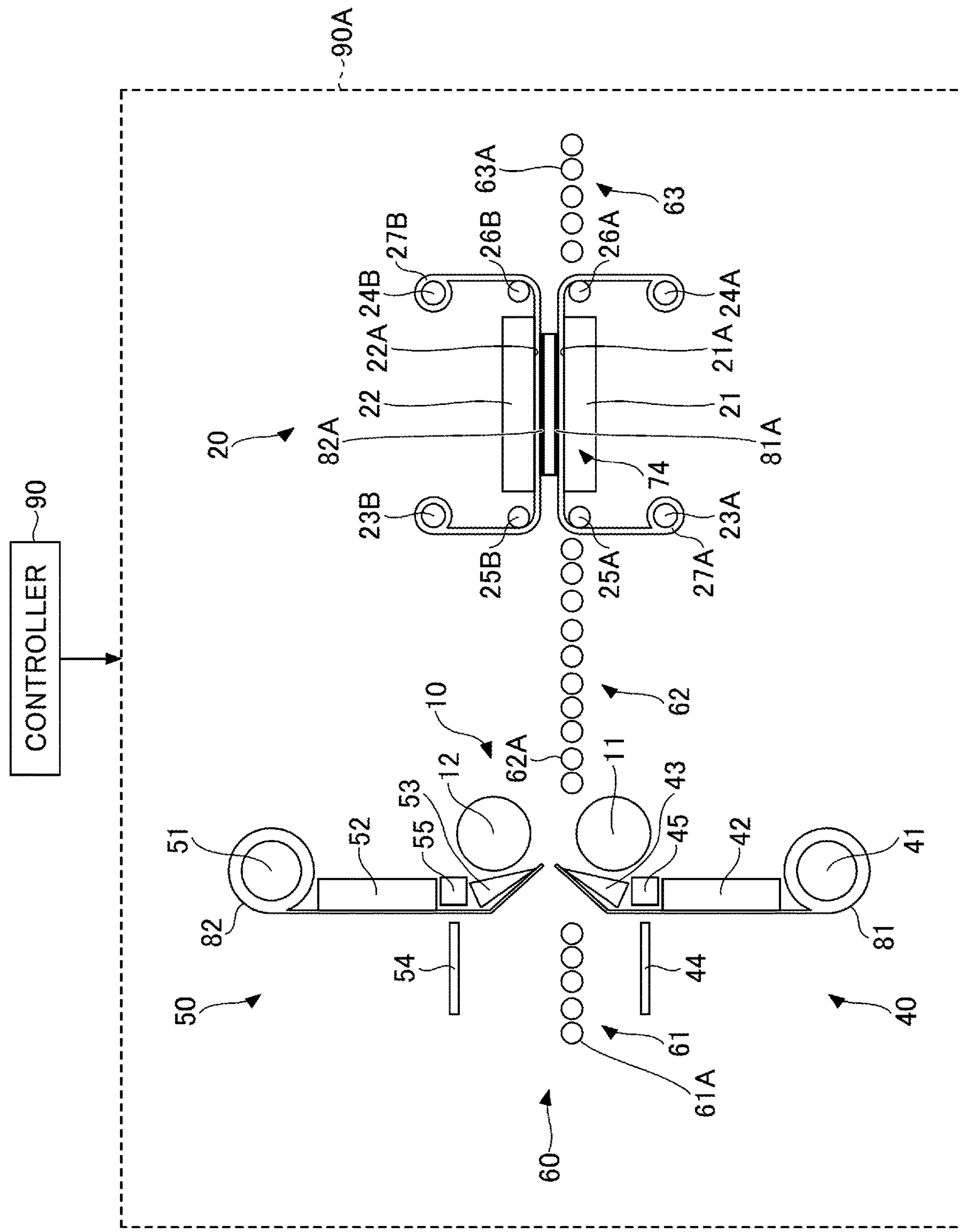
FIG. 6 is a schematic diagram (part 3) illustrating the operation of the resist layer forming apparatus according to the first embodiment.

Next, in the forming press 20, the first transfer film 27A and the second transfer film 27B transport the resist-deposited base 74 to the position between the first metal plate 21 and the second metal plate 22, as illustrated in FIG. 6. Then, the first metal plate 21 and the second metal plate 22 press against the resist-deposited base 74. A pressure (second pressure) applied to the resist-deposited base 74 from the first metal plate 21 and the second metal plate 22 is set higher than the first pressure. The second pressure is preferably in a range of 1.0 MPa to 2.0 MPa, and more preferably in a range of 1.2 MPa to 1.8 MPa. In addition, a temperature (second temperature) of the first metal plate 21 and the second metal plate 22 is set lower than the first temperature. The second temperature is preferably in a range of 40° C. to 90° C., and more preferably in a range of 50° C. to 80° C.

When the first metal plate 21 and the second metal plate 22 press against the resist-deposited base 74, the gaps 83A, 83B, 84A, and 84B are substantially eliminated, as illustrated in FIG. 8C. For example, air occupying the gap 83A or 83B may be discharged to the outside from between the first seed layer 76 and the first plating resist layer 81A, or fractionalized and dispersed between the first seed layer 76 and the first plating resist layer 81A. Similarly, the air occupying the gap 84A or 84B may be discharged to the outside from between the second seed layer 77 and the second plating resist layer 82A, or fractionalized and dispersed between the second seed layer 77 and the second plating resist layer 82A.

Thereafter, the first transport film 27A and the second transport film 27B transport the resist-deposited base 74 to the third transport unit 63.

Figure 7:
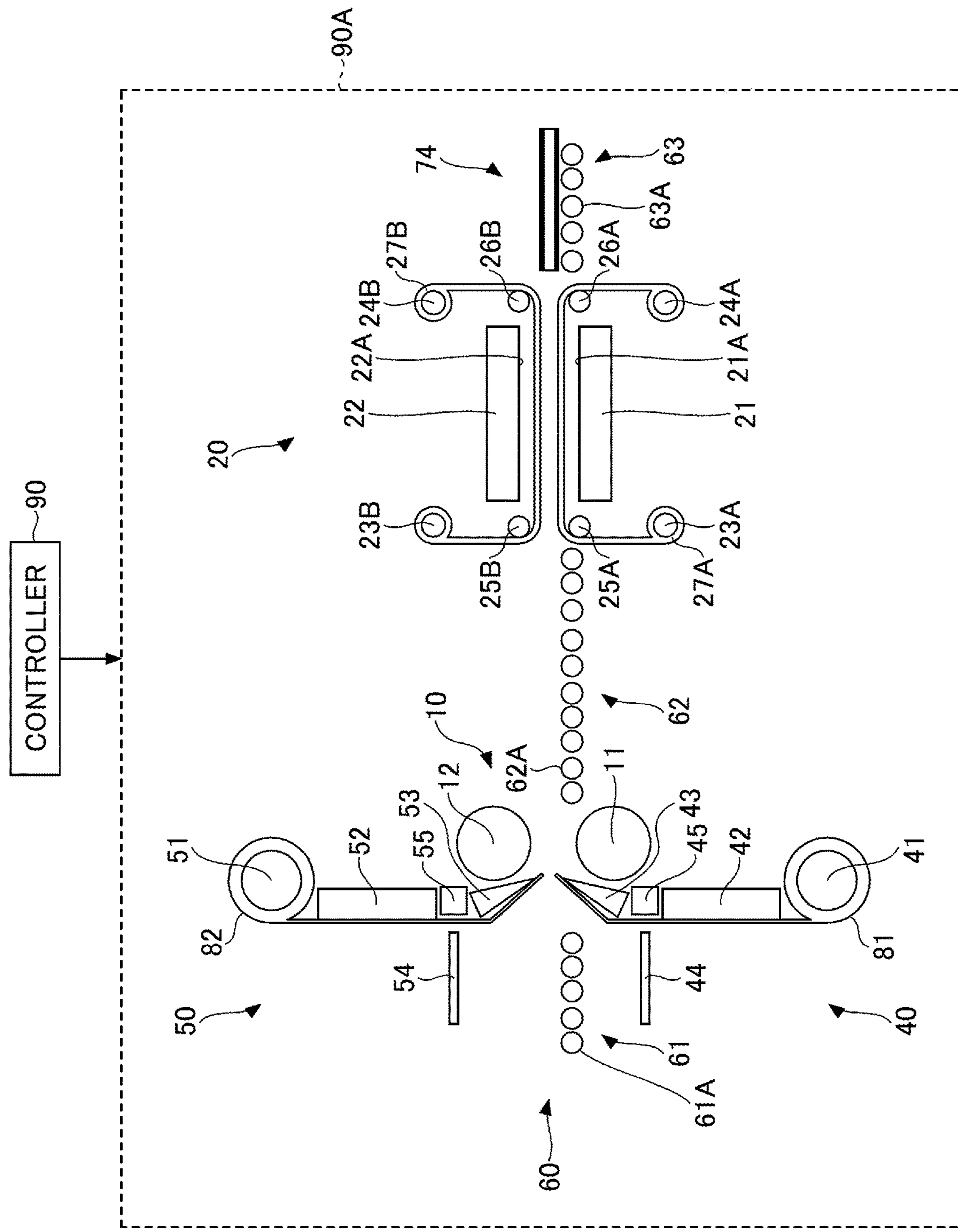
FIG. 7 is a schematic diagram (part 4) illustrating the operation of the resist layer forming apparatus according to the first embodiment.
Figure 8A:
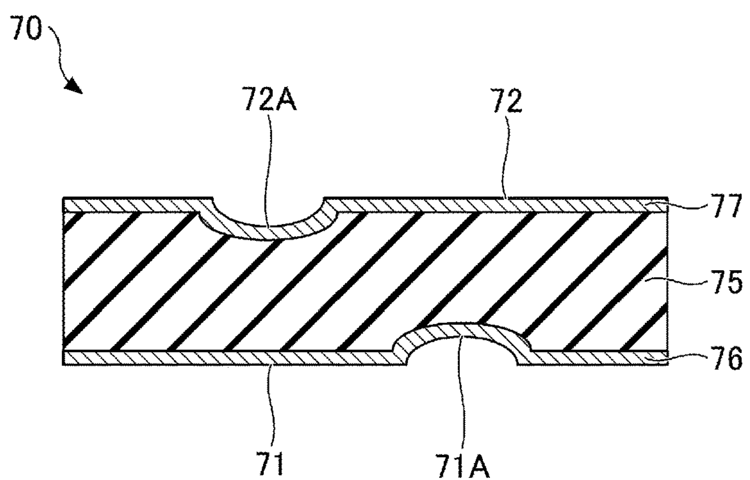
FIG. 8A, FIG. 8B, and FIG. 8C are cross sectional views illustrating processes of forming a plating resist layer.
Figure 8B:
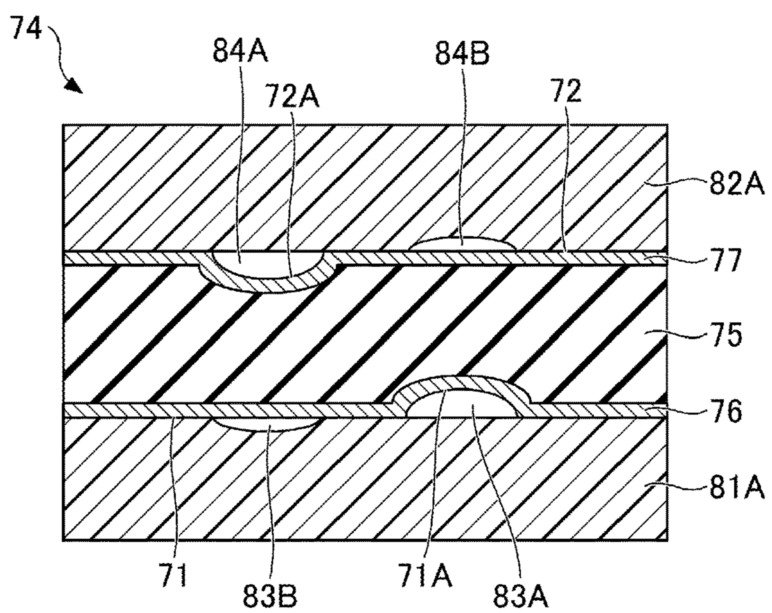
Figure 8C:
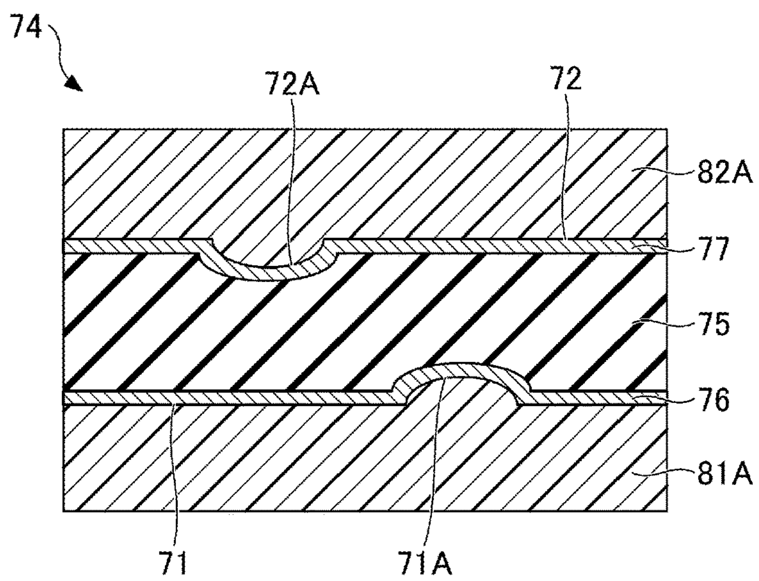

When the resist-deposited base 74 is output from the forming press 20, the third transport unit 63 transports the resist-deposited base 74 to the subsequent stage, as illustrated in FIG. 7.

The resist layer forming apparatus 1 operates in the manner described above.

In the resist layer forming apparatus 1, because the second pressure in the forming press 20 is higher than the first pressure in the laminator 10, the gaps 83A, 83B, 84A, and 84B can be substantially eliminated by the pressing using the forming press 20, even if the gaps 83A, 83B, 84A, and 84B are generated in the laminator 10.

If the second temperature in the forming press 20 is higher than the first temperature in the laminator 10, micro bubbles present inside vias or the like of the base 70 may move to the position between the first seed layer 76 and the first plating resist layer 81A, or to the position between the second seed layer 77 and the second plating resist layer 82A in the forming press 20, due to thermal expansion. If the micro bubbles move due to the thermal expansion, the micro bubbles may remain between the first seed layer 76 and the first plating resist layer 81A, or between the second seed layer 77 and the second plating resist layer 82A, even after the pressing using the forming press 20. In contrast, according to the present embodiment, it is possible to reduce the movement of the micro bubbles caused by the thermal expansion, because the second temperature is lower than the first temperature.

[Method of Forming Interconnect Layer]

Figure 9A:
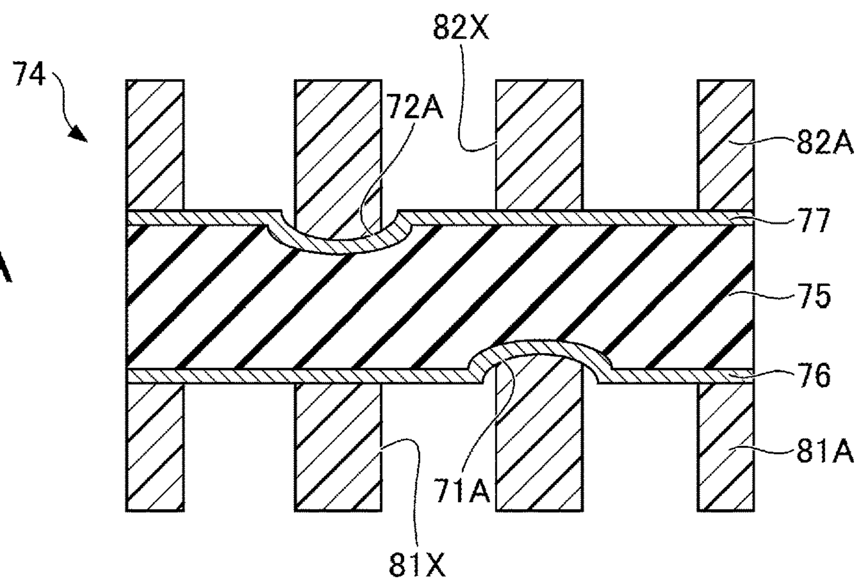
FIG. 9A, FIG. 9B, and FIG. 9C are cross sectional views illustrating a method of forming an interconnect layer.
Figure 9B:
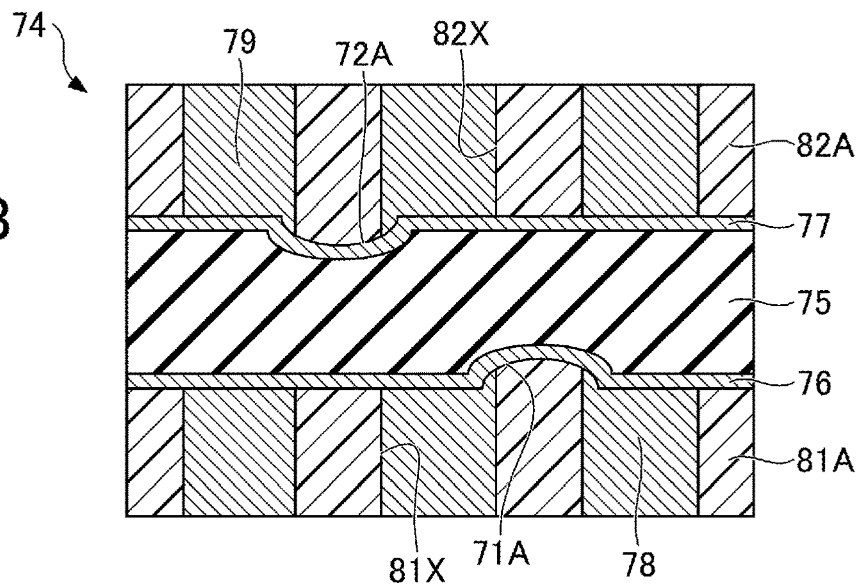
Figure 9C:
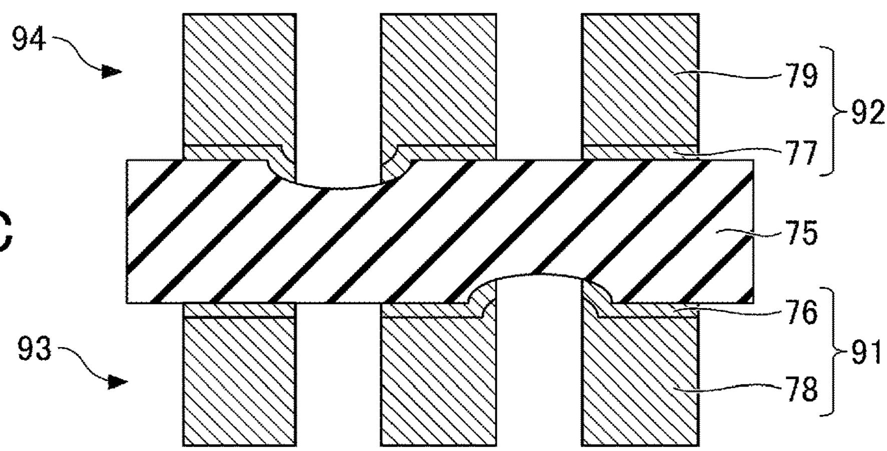

Next, a method of forming an interconnect layer using the resist-deposited base 74 output from the resist layer forming apparatus 1 will be described. FIG. 9A through FIG. 9C are cross sectional views illustrating the method of forming the interconnect layer.

First, the first plating resist layer 81A and the second plating resist layer 82A are exposed and developed, to thereby foam the opening 81X in the first plating resist layer 81A, and form the opening 82X in the second plating resist layer 82A, as illustrated in FIG. 9A. In this state, there is substantially no gap formed between the first plating resist layer 81A and the first surface 71, and there is substantially no gap formed between the second plating resist layer 82A and the second surface 72.

Next, a first metal plating layer 78 is formed inside the opening 81X of the first plating resist layer 81A by an electrolytic plating method which utilizes the first seed layer 76 for the plating power supply path, as illustrated in FIG. 9B. Similarly, a second metal plating layer 79 is formed inside the opening 82X of the second plating resist layer 82A by an electrolytic plating method which utilizes the second seed layer 77 for the plating power supply path. In this state, the first plating resist layer 81A is not formed between the base 75 and the first plating resist layer 81A, and the second plating resist layer 82A is not formed between the base 75 and the second plating resist layer 82A.

Next, the first plating resist layer 81A and the second plating resist layer 82A are removed, as illustrated in FIG. 9C. Further, the first seed layer 76 is removed by a flush etching, using the first metal plating layer 78 as a mask, and the second seed layer 77 is removed by a flush etching, using the second metal plating layer 79 as a mask. Accordingly, a plurality of first conductive patterns 91 including the first seed layer 76 and the first metal plating layer 78, and a plurality of second conductive patterns 92 including the second seed layer 77 and the second metal plating layer 79, are formed. A first interconnect layer 93 is formed from the plurality of first conductive patterns 91, and a second interconnect layer 94 is formed from the plurality of second conductive patterns 92.

Because the first plating resist layer 81A is not formed between the base 75 and the first plating resist layer 81A, the mutually adjacent first conductive patterns 91 are appropriately electrically isolated from each other by the removal of the first seed layer 76. Similarly, because the second plating resist layer 82A is not formed between the base 75 and the second plating resist layer 82A, the mutually adjacent second conductive patterns 92 are appropriately electrically isolated from each other by the removal of the second seed layer 77.

Second Embodiment

Next, a second embodiment will be described. The second embodiment mainly differs from the first embodiment in that a roll press machine is provided between the laminator 10 and the forming press 20.

[Configuration of Resist Layer Forming Apparatus]

Figure 10:
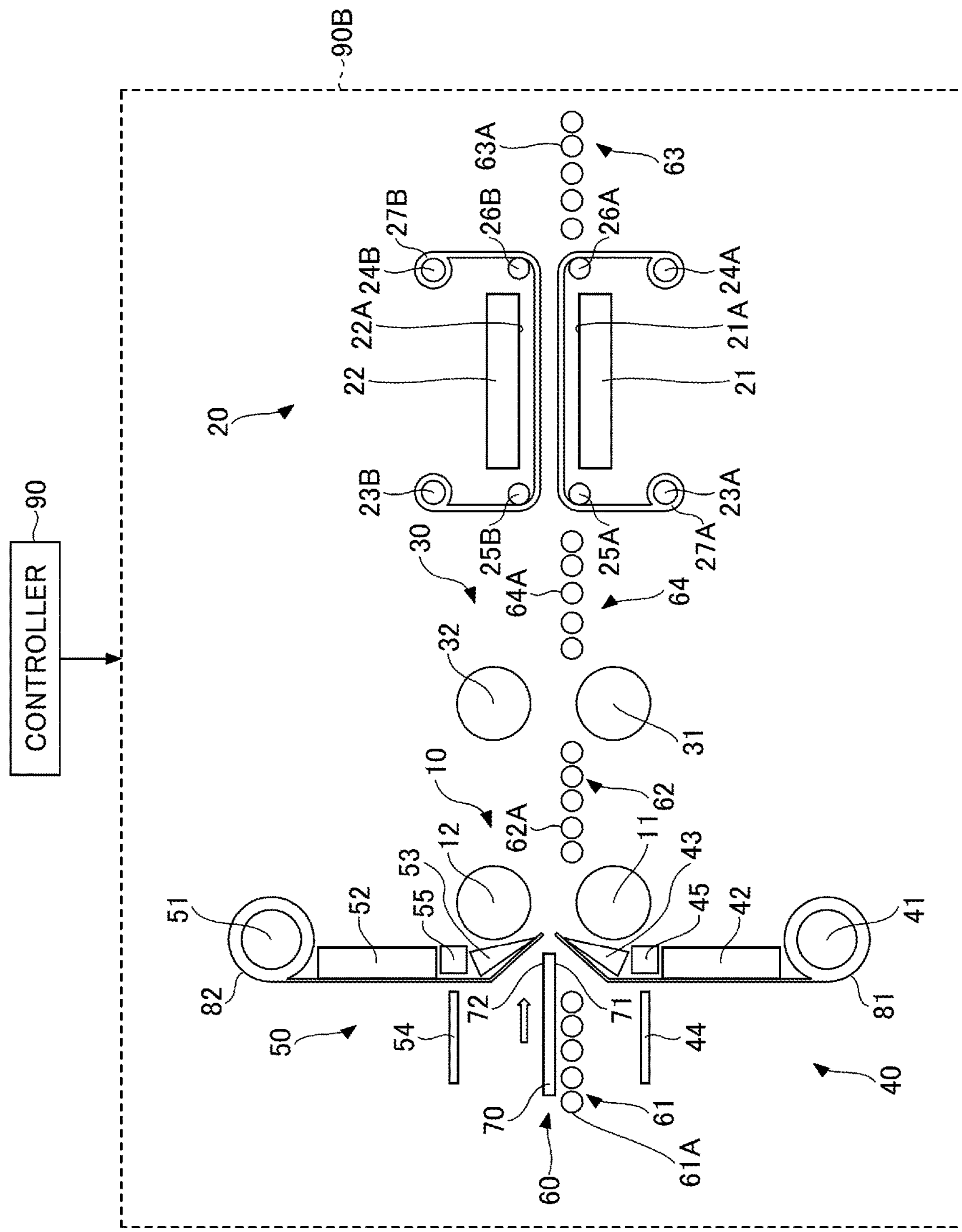
FIG. 10 is a schematic diagram illustrating the resist layer forming apparatus according to a second embodiment.

FIG. 10 is a schematic diagram illustrating the resist layer forming apparatus according to a second embodiment. A resist layer forming apparatus 2 according to the second embodiment mainly includes a roll press machine 30 for roll-pressing a target member, in addition to the laminator 10, the forming press 20, the first feeding unit 40, the second feeding unit 50, the transport passage 60, and the controller 90.

The transport passage 60 includes a fourth transport unit 64, in addition to the first transport unit 61, the second transport unit 62, and the third transport unit 63. The fourth transport unit 64 is disposed between the second transport unit 62 and the third transport unit 63. The roll press machine 30 is disposed between the second transport unit 62 and the fourth transport unit 64.

In the present embodiment, the second transport unit 62 transports the resist-deposited base 74 output from the laminator 10 to the roll press machine 30, instead of the forming press 20.

The roll press machine 30 includes a first pressure roller 31, and a second pressure roller 32. The first pressure roller 31 and the second pressure roller 32 have a generally cylindrical shape. The first pressure roller 31 and the second pressure roller 32 are disposed so as to sandwich the transport passage 60 therebetween. The first pressure roller 31 is disposed under the transport passage 60 so as to press against the first surface 71 of the resist-deposited base 74, and the second pressure roller 32 is disposed above the transport passage 60 so as to press against the second surface 72 of the resist-deposited base 74. The roll press machine 30 presses the resist-deposited base 74 while rotating the first pressure roller 31 and the second pressure roller 32.

The fourth transport unit 64 includes a plurality of transport rollers 64A, and transports the resist-deposited base 74 output from the roll press machine 30 to the forming press 20.

The controller 90 controls the operation of a processing system 90B including the laminator 10, the forming press 20, the roll press machine 30, the first feeding unit 40, the second feeding unit 50, and the transport passage 60.

Other configurations of the resist layer forming apparatus 2 are similar to those of the first embodiment.

<Operation of Resist Layer Forming Apparatus>

Figure 11:
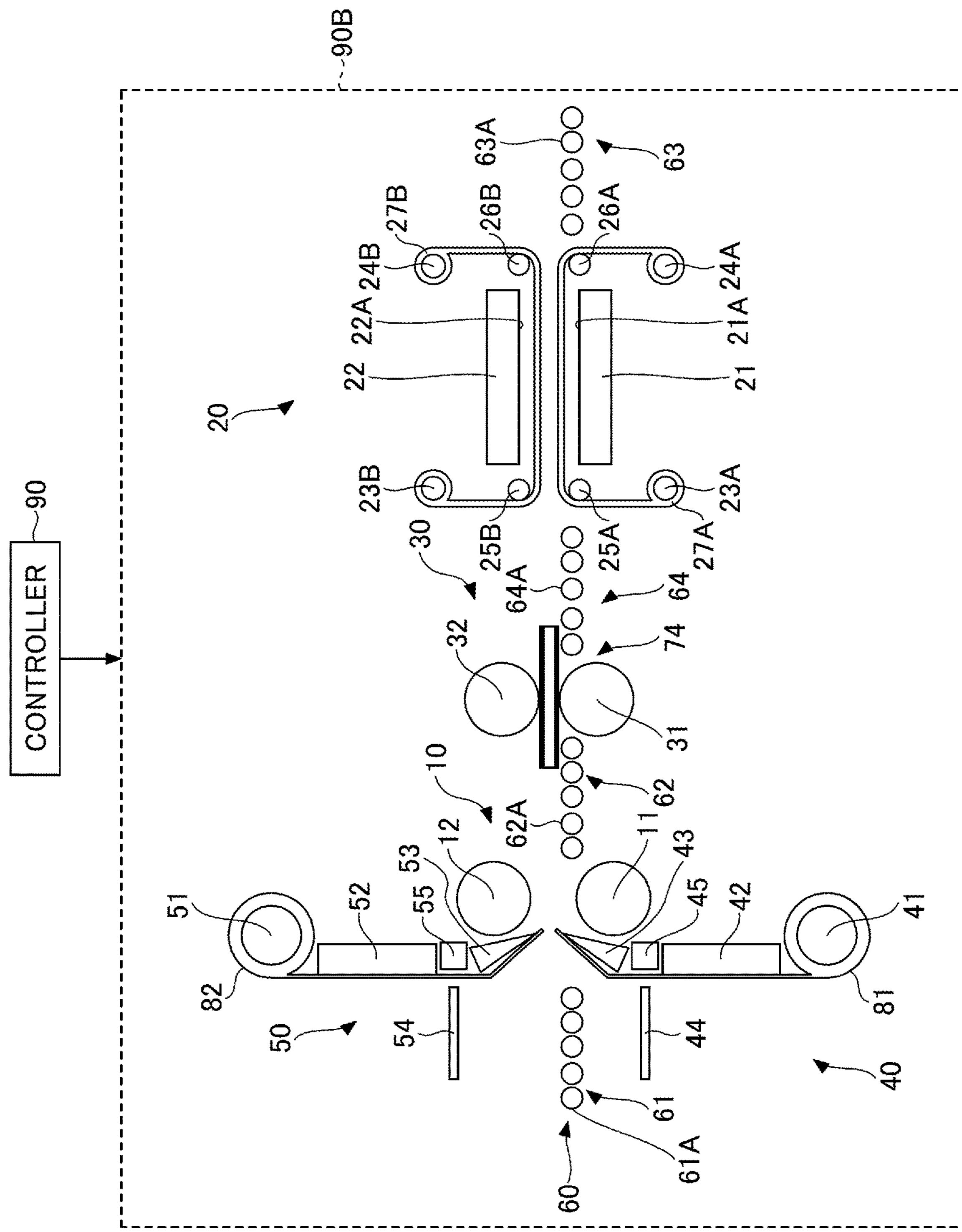
FIG. 11 is a schematic diagram illustrating an operation of the resist layer forming apparatus according to the second embodiment.

Next, an operation of the resist layer forming apparatus 2, that is, the resist layer forming method, will be described. FIG. 11 is a schematic diagram illustrating the operation of the resist layer forming apparatus 2. The series of operations illustrated in FIG. 11 is controlled by the controller 90.

First, similar to the first embodiment, the laminator 10 laminates the first plating resist layer 81A made of the first DFR 81 on the first surface 71 of the base 70, and the second plating resist layer 82A made of the second DFR 82 on the second surface 72 of the base 70. Then, the second transport unit 62 transports the resist-deposited base 74 to the roll press machine 30.

When the resist-deposited base 74 is transported to the roll press machine 30, the roll press machine 30 presses the resist-deposited base 74 while rotating the first pressure roller 31 and the second pressure roller 32, as illustrated in FIG. 11. A pressure (third pressure) applied from the first pressure roller 31 and the second pressure roller 32 to the resist-deposited base 74 is lower than the second pressure. The third pressure is set approximately the same as the first pressure, for example. The third pressure is preferably in a range of 0.2 MPa to 0.6 MPa, and more preferably in a range of 0.3 MPa to 0.5 MPa. In addition, a temperature (third temperature) of the first pressure roller 31 and the second pressure roller 32 is higher than the second temperature. The third temperature is set approximately the same as the first temperature, for example. The third temperature is preferably in a range of 60° C. to 140° C., and more preferably in a range of 80° C. to 120° C.

When the resist-deposited base 74 is output from the roll press machine 30, the fourth transport unit 64 transports the resist-deposited base 74 to the forming press 20. Next, similar to the first embodiment, the forming press 20 presses the resist-deposited base 74. The second pressure is set higher than each of the first pressure and the third pressure, and the second temperature is set lower than each of the first temperature and the third temperature. When the resist-deposited base 74 is output from the forming press 20, the third transport unit 63 transports the resist-deposited base 74 to the subsequent stage.

The resist layer forming apparatus 2 operates in the manner described above.

In the resist layer forming apparatus 2, the roll press machine 30 is provided between the laminator 10 and the foaming press 20, and the roll press machine 30 presses the resist-deposited base 74. In addition, the second pressure is set higher than each of the first pressure and the third pressure, and the second temperature is set lower than each of the first temperature and the third temperature. For this reason, even if the gaps 83A, 83B, 84A and 84B are generated in the laminator 10, these gaps 83A, 83B, 84A and 84B are more easily eliminated.

In other words, before the pressing by the forming press 20, the roll press machine 30 applies the third pressure, which is relatively small, to the resist-deposited base 74 starting from a front end of the resist-deposited base 74. For this reason, elimination of air voids between the seed layer 102 and the plating resist layer 103 is facilitated. In addition, although the roll press of the roll press machine 30 may not be able to completely eliminate the air voids, the air voids can be divided into micro bubbles. Hence, when the pressing is thereafter performed by the forming press 20, the micro bubbles are scattered. Further, even if the surface of the insulating layer 101 includes irregularities, the pressing by the foaming press 20 can cause the plating resist layer 103 to follow the irregularities on the surface of the insulating layer 101.

Third Embodiment

Next, a third embodiment will be described. The third embodiment relates to a method for manufacturing a wiring board using the resist layer forming apparatus 1 according to the first embodiment or the resist layer forming apparatus 2 according to the second embodiment. FIG. 12A through FIG. 14B are cross sectional views illustrating the method for manufacturing the wiring board according to the third embodiment.

Figure 12A:
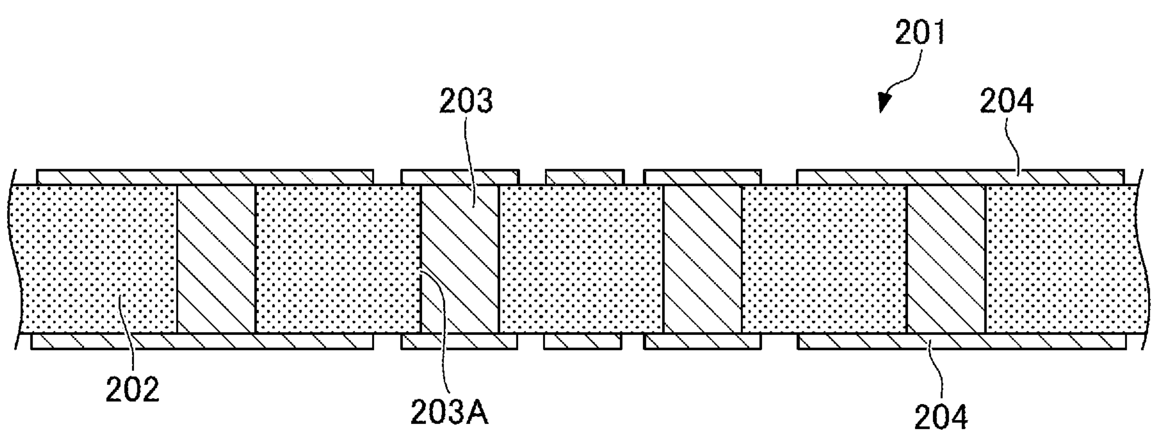
FIG. 12A and FIG. 12B are cross sectional views (part 1) illustrating a method for manufacturing a wiring board according to a third embodiment.

First, a core wiring board 201 is prepared as a support, as illustrated in FIG. 12A. The core wiring board 201 includes a core board 202, and a first interconnect layer 204. Through holes 203A penetrating the core board 202 in a thickness direction are formed in the core board 202, and a through conductor 203 is provided inside each of the through holes 203A. The through hole 203A may be formed by processes such as drilling, laser machining, or the like, for example, and the through conductor 203 and the first interconnect layer 204 may be formed by plating, photolithography, or the like, for example. A large board from which a plurality of wiring boards 200 can be obtained, may be used for the core wiring board 201. In other words, the core wiring board 201 has a plurality of areas in which structures corresponding to the wiring board 200 are formed.

Figure 12B:
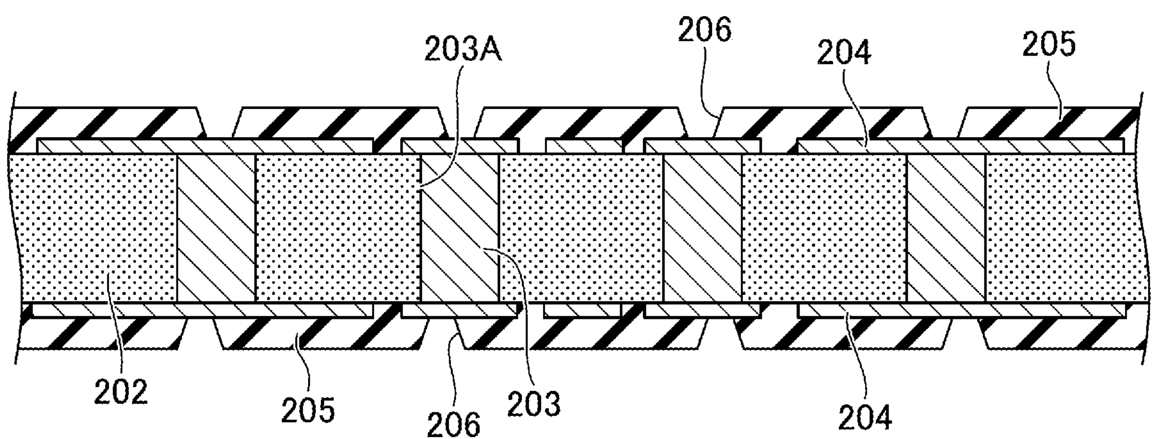

Next, an uncured resin film is deposited on both surfaces of the core board 202, and a heat treatment is performed to cure the resin film and form the first insulating layer 205, as illustrated in FIG. 12B. The first insulating layer 205 is famed of an insulating resin, such as epoxy resins, polyimide resins, or the like, for example. The first insulating layer 205 may be formed by coating a liquid resin. Thereafter, the first insulating layers 205 on both surfaces of the core board 202 are subjected to a laser machining, to form via holes 206 in the first insulating layer 205 reaching a connection portion of the first interconnect layer 204.

Figure 13A:
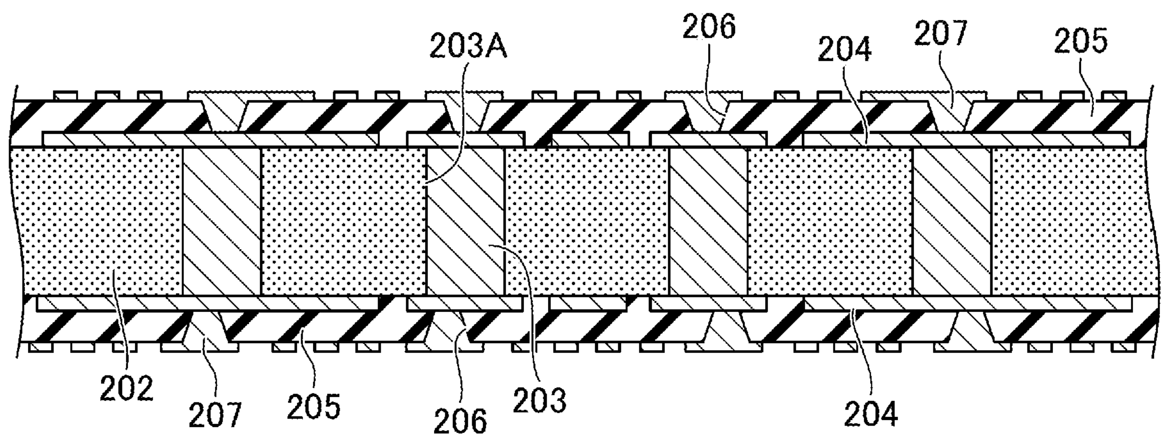
FIG. 13A and FIG. 13B are cross sectional views (part 2) illustrating the method for manufacturing the wiring board according to the third embodiment.

Next, a second interconnect layer 207, which is connected to the first interconnect layer 204 via a via conductor inside the via hole 206, is famed on the first insulating layer 205 on both surfaces of the core board 202, as illustrated in FIG. 13A.

A method of foaming the second interconnect layer 207 will be described. FIG. 15A through FIG. 16B are cross sectional views illustrating the method of forming the second interconnect layer 207 according to the third embodiment.

Figure 15A:
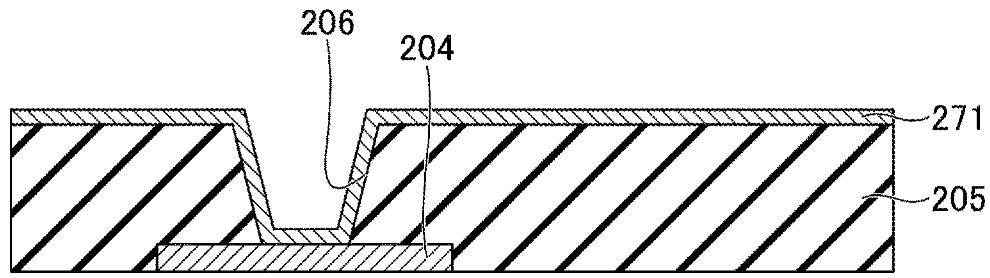
FIG. 15A, FIG. 15B, and FIG. 15C are cross sectional views (part 1) illustrating a method of forming the interconnect layer according to the third embodiment.

First, a seed layer 271 made of copper or the like is formed on the first insulating layer 205 and on an inner surface of the via hole 206 by an electroless plating method or a sputtering method, as illustrated in FIG. 15A.

Figure 15B:
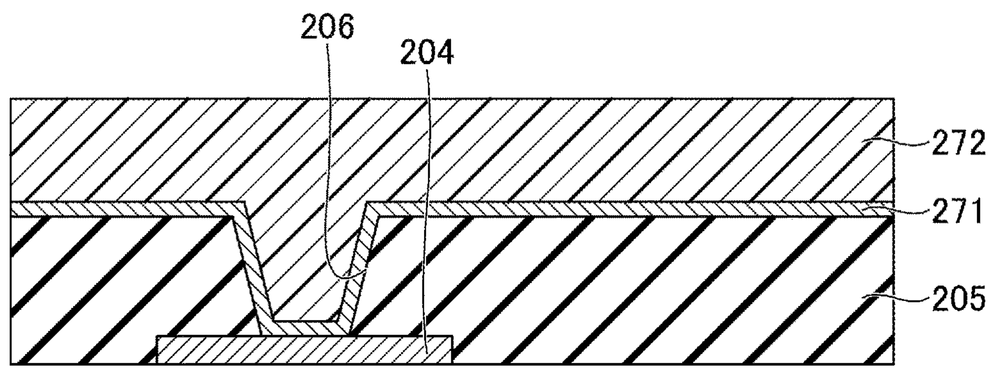

Next, a plating resist layer 272 is formed on the seed layer 271, as illustrated in FIG. 15B. The plating resist layer 272 is formed using the resist layer forming apparatus 1 according to the first embodiment or the resist layer forming apparatus 2 according to the second embodiment. In other words, the structure illustrated in FIG. 15A is used as the base 70, and the first plating resist layer 81A and the second plating resist layer 82A are formed as the plating resist layer 272. By using the resist layer forming apparatus 1, the plating resist layer 272 can be famed substantially without generating a gap between the seed layer 271 and the plating resist layer 272.

Figure 15C:
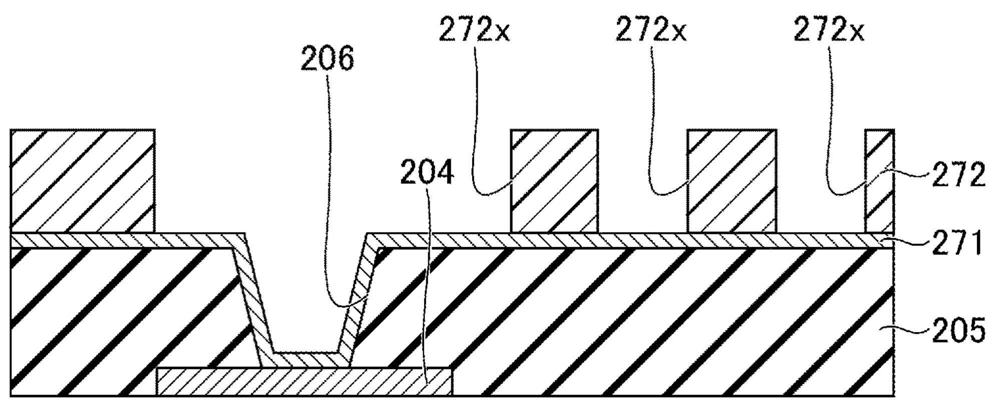

Next, the plating resist layer 272 is exposed and developed, to form an opening 272X in the plating resist layer 272, as illustrated in FIG. 15C.

Figure 16A:
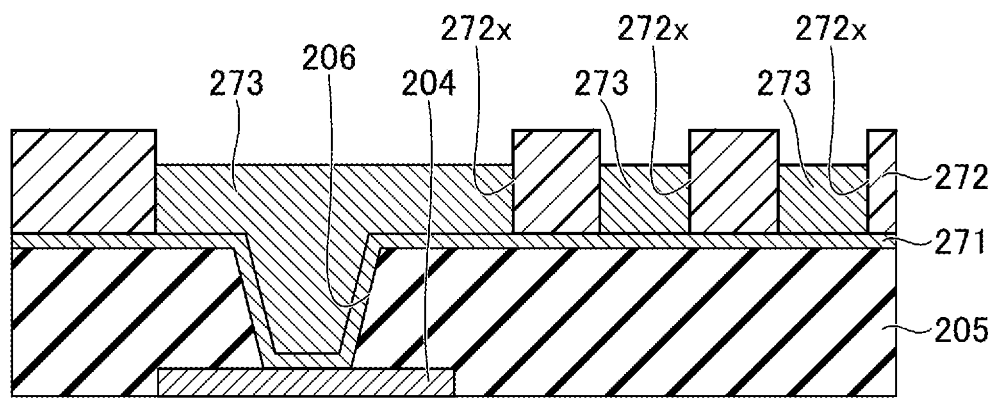
FIG. 16A and FIG. 16B are cross sectional views (part 2) illustrating the method of forming the interconnect layer according to the third embodiment.

Next, a metal plating layer 273 made of copper or the like is formed inside the opening 272X of the plating resist layer 272, by an electrolytic plating which utilizes the seed layer 271 for a plating power supply path, as illustrated in FIG. 16A.

Figure 16B:
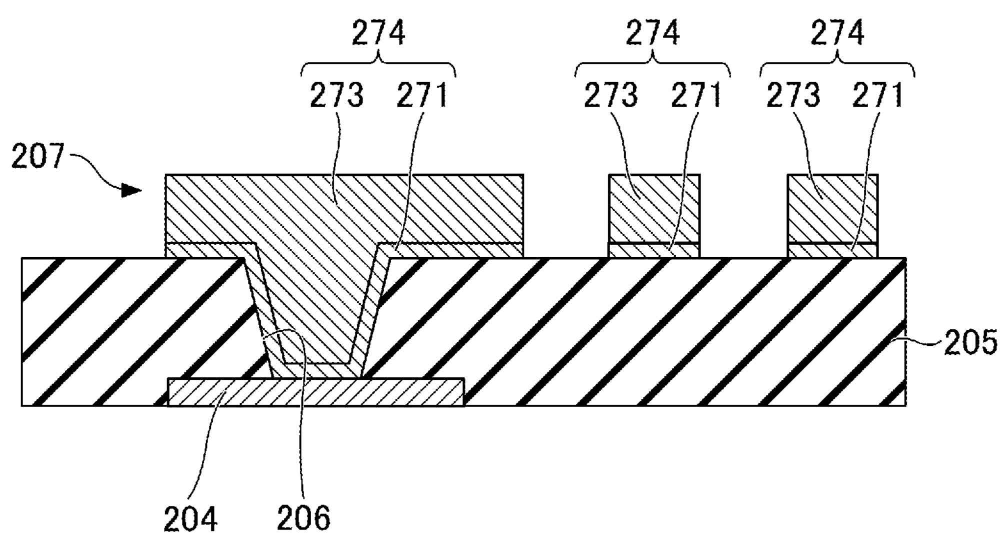

Next, the plating resist layer 272 is removed, as illustrated in FIG. 16B. In addition, the seed layer 271 is removed by a flush etching, using the metal plating layer 273 as a mask. In this manner, a plurality of conductive patterns 274, including the seed layer 271 and the metal plating layer 273, is formed. The second interconnect layer 207 is formed from the plurality of conductive patterns 274.

Figure 13B:
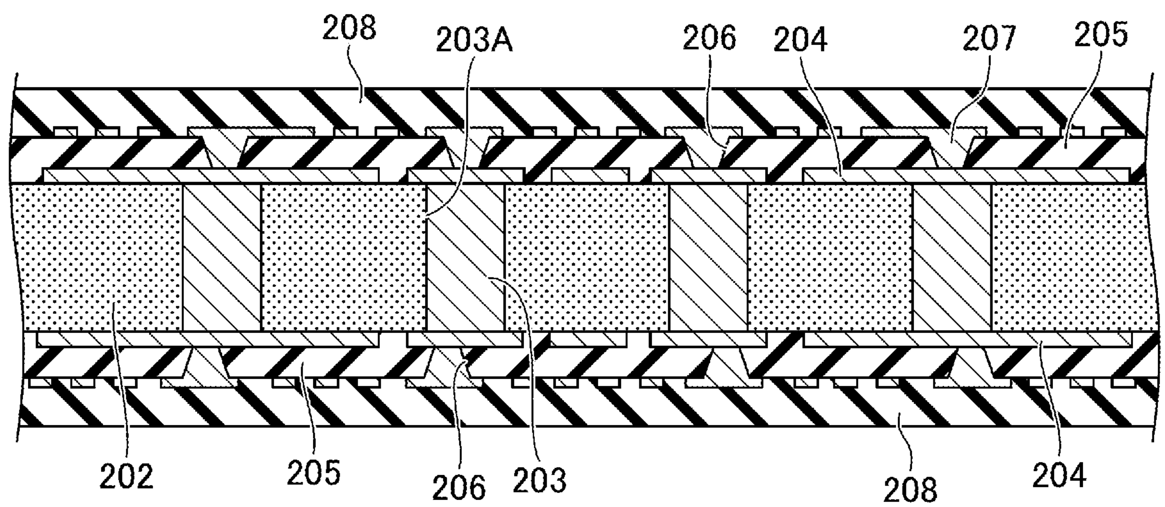

After forming the second interconnect layer 207, a second insulating layer 208 is formed on the first insulating layer 205, as illustrated in FIG. 13B. The second insulating layer 208 can be formed by the same method as the first insulating layer 205.

Figure 14A:
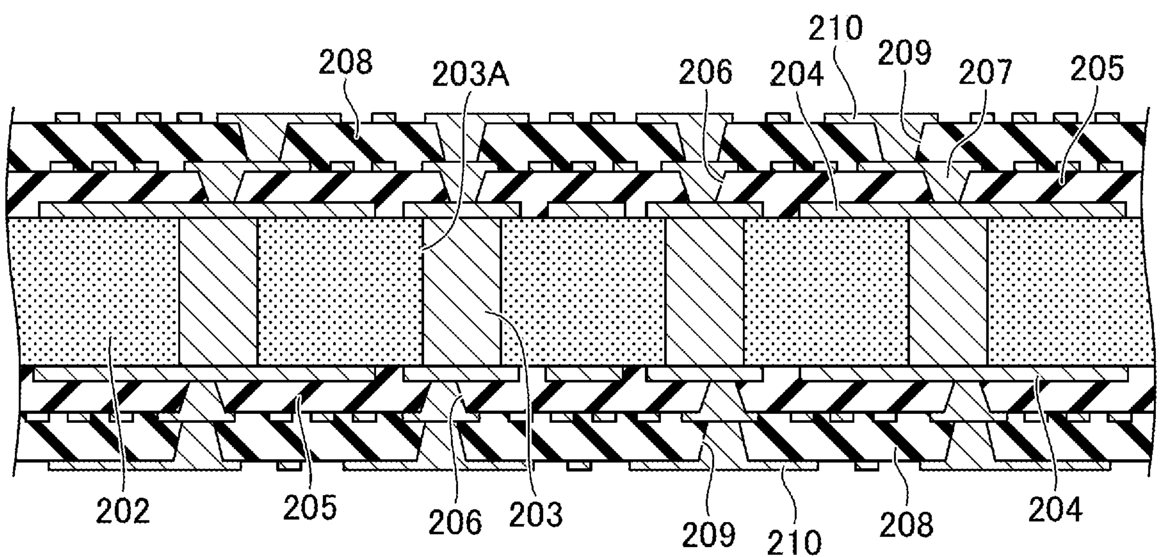
FIG. 14A and FIG. 14B are cross sectional views (part 3) illustrating the method for manufacturing the wiring board according to the third embodiment.

Next, the second insulating layer 208 on both surfaces of the core board 202 is subjected to a laser machining, to form via holes 209 in the second insulating layer 208 reaching a connection portion of the second interconnect layer 207, as illustrated in FIG. 14A. In addition, a third interconnect layer 210, which is connected to the second interconnect layer 207 via a via conductor in the via hole 209, is formed on the second insulating layer 208 on both surfaces of the core board 202. The third interconnect layer 210 can be formed by the same method as the second interconnect layer 207.

Figure 14B:
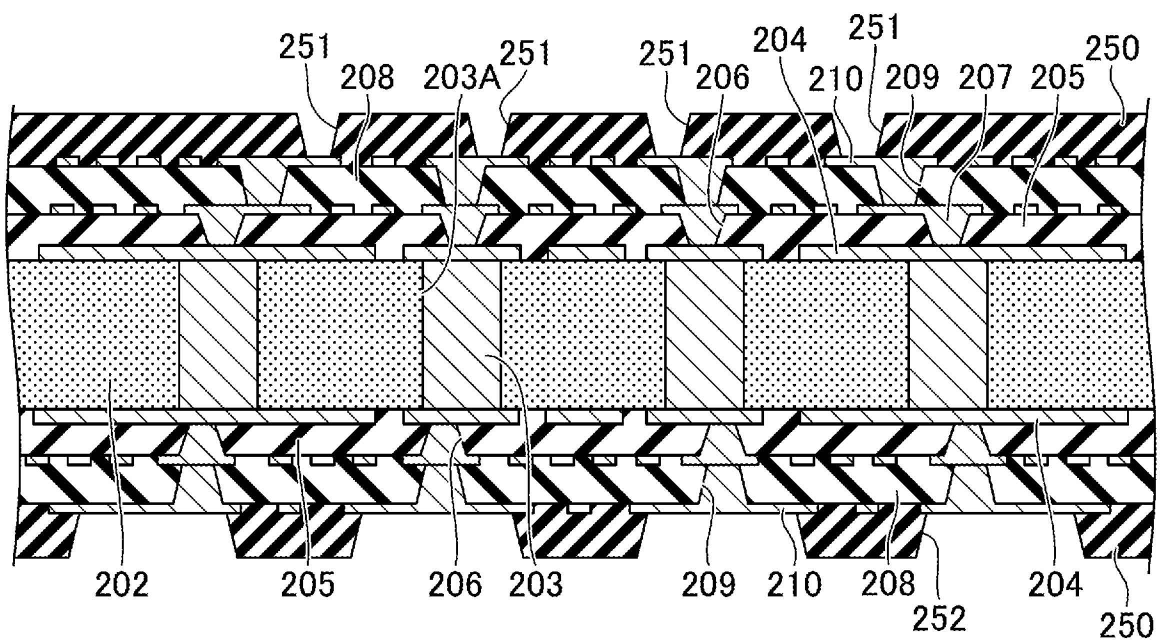

Next, a solder resist layer 250 is formed on the second insulating layer 208 on both surfaces of the core board 202, as illustrated in FIG. 14B. The solder resist layer 250 is famed of an insulating resin, such as photosensitive epoxy resins, acrylic resins, or the like, for example. The solder resist layer 250 may be formed by pasting a resin film, or coating a liquid resin.

When forming the solder resist layer 250 using a resin film, the resist layer forming apparatus 1 according to the first embodiment or the resist layer forming apparatus 2 according to the second embodiment may be used. In other words, the solder resist layer 250 is formed in place of the first plating resist layer 81A and the second plating resist layer 82A, using the structure illustrated in FIG. 14A as the base 70, and using the resin film in place of the first DFR 81 and the second DFR 82. By using the resist layer forming apparatus 1, the solder resist layer 250 can be formed substantially without generating a gap between the second insulating layer 208 and the solder resist layer 250.

After forming the solder resist layer 250, openings 251, which reach a connection portion of the third interconnect layer 210, are formed in the solder resist layer 250 on the surface of the core board 202 to be connected to a semiconductor chip. In addition, openings 252, which reach the connection portion of the third interconnect layer 210, are formed in the solder resist layer 250 on the surface of the core board 202 opposite to the surface of the core board 202 to be connected to the semiconductor chip.

The openings 251 and the openings 252 can be formed by exposure and development processes. When the solder resist layer 250 is famed substantially without generating a gap between the second insulating layer 208 and the solder resist layer 250, it is possible to improve the accuracy of the exposure.

Insulating resins, such as non-photosensitive epoxy resins, polyimide resins, or the like, for example, may be used for the solder resist layer 250. In this case, the openings 251 and the openings 252 can be formed by laser machining, blasting, or the like.

Next, the structure illustrated in FIG. 14B is cut by a slicer or the like. Hence, a structure corresponding to the wiring board is singulated, and a plurality of wiring boards is obtained from the large core wiring board 201.

According to this method, it is possible to reduce a short circuit between the conductive patterns of the second interconnect layer 207 and the third interconnect layer 210.

The resist layer forming apparatus of the present disclosure can also be used to form a resist layer when forming an interconnect layer by a subtractive method. In this case, the resist layer can be formed on a metal plating layer, substantially without generating a gap between the metal plating layer and the resist layer, for example. Further, the exposure of the resist layer to form the opening can be performed with a high accuracy.

Accordingly to each of the embodiments described above, it is possible to reduce a short circuit from occurring between conductive patterns.

Although the embodiments are numbered with, for example, “first,” “second,” or “third,” the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A resist layer forming method comprising:

laminating a resist layer on a base at a first pressure using a laminate roller having a first temperature;

pressing the resist layer against the base at a second pressure higher than the first pressure using a metal plate having a second temperature lower than the first temperature; and roll-pressing the resist layer against the base at a third pressure, using a pressure roller having a third temperature, between the laminating the resist layer on the base and the pressing the resist layer against the base, wherein the second temperature is lower than each of the first temperature and the third temperature, and wherein the second pressure is higher than each of the first pressure and the third pressure.

2. The resist layer forming method as claimed in claim 1, wherein the first temperature is in a range of 60° C. to 140° C., and the second temperature is in a range of 40° C. to 90° C.

3. The resist layer forming method as claimed in claim 2, wherein the first pressure is in a range of 0.2 MPa to 0.6 MPa, and the second pressure is in a range of 1.0 MPa and 2.0 MPa.

4. The resist layer forming method as claimed in claim 1, wherein the first pressure is in a range of 0.2 MPa to 0.6 MPa, and the second pressure is in a range of 1.0 MPa and 2.0 MPa.

5. The resist layer forming method as claimed in claim 1, wherein the third pressure is in a range of 0.2 MPa and 0.6 MPa.

6. The resist layer forming method as claimed in claim 1, wherein the third pressure is in a range of 0.3 MPa and 0.5 MPa.

7. A method for manufacturing a wiring board, comprising:

preparing, as the base, a first base having a seed layer formed on at least one surface thereof;

forming the resist layer on the seed layer of the first base, by the resist layer forming method according to claim 1;

forming an opening in the resist layer after the pressing;

forming a metal plating layer inside the opening by an electrolytic plating method which utilizes the seed layer for a plating power supply path;

removing the resist layer after forming the metal plating layer;

removing the seed layer after removing the resist layer, using the metal plating layer as a mask.

* * * * *